(12) United States Patent
Tanaya et al.

(10) Patent No.: US 7,279,824 B2
(45) Date of Patent: Oct. 9, 2007

(54) PIEZOELECTRIC RESONATOR ELEMENT, PIEZOELECTRIC DEVICE, METHOD OF MANUFACTURING THE SAME, CELLULAR PHONE DEVICE UTILIZING PIEZOELECTRIC DEVICE, AND ELECTRONIC EQUIPMENT UTILIZING PIEZOELECTRIC DEVICE

(75) Inventors: Hideo Tanaya, Suwa (JP); Toshinari Jokura, Okaya (JP); Atsushi Oshiro, Minowa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/976,246

(22) Filed: Oct. 27, 2004

(65) Prior Publication Data

US 2005/0116586 A1 Jun. 2, 2005

(30) Foreign Application Priority Data

Oct. 28, 2003 (JP) ............................ 2003-367743

(51) Int. Cl.
*H01L 41/08* (2006.01)
(52) U.S. Cl. ...................... 310/344; 310/370
(58) Field of Classification Search ............... 310/364, 310/370, 344, 348
See application file for complete search history.

(56) References Cited

U.S. PATENT DOCUMENTS

| | | | | |
|---|---|---|---|---|
| 4,035,673 A | * | 7/1977 | Ishida et al. | 310/344 |
| 4,384,232 A | | 5/1983 | Debely | |
| 4,405,875 A | * | 9/1983 | Nagai | 310/344 |
| 4,445,066 A | | 4/1984 | Nishiyama et al. | |
| 4,561,286 A | * | 12/1985 | Sekler et al. | 73/24.06 |
| 4,652,787 A | * | 3/1987 | Zingg | 310/344 |
| 6,445,254 B1 | * | 9/2002 | Shibuya et al. | 331/68 |
| 6,587,009 B2 | * | 7/2003 | Kitamura et al. | 331/158 |
| 6,628,179 B2 | * | 9/2003 | Yatsuda et al. | 333/193 |
| 6,768,247 B2 | * | 7/2004 | Kitamura et al. | 310/370 |
| 6,894,428 B2 | * | 5/2005 | Tanaya et al. | 310/370 |
| 6,927,530 B2 | * | 8/2005 | Tanaya et al. | 310/348 |
| 2002/0121175 A1 | | 9/2002 | Kitamura et al. | |
| 2003/0067248 A1 | | 4/2003 | Piazza et al. | |

FOREIGN PATENT DOCUMENTS

| | | |
|---|---|---|
| JP | 52-052597 | 4/1977 |
| JP | 55-138916 | 10/1980 |
| JP | 2002-261575 | 9/2002 |

OTHER PUBLICATIONS

Patent Abstracts of Japan for No. JP2002261575 (Sep. 13, 2002).
1 Page Abstract for 04025568.9 (date unknown).
Communication from European Patent Office re: counterpart application, date unknown.
Communication from European patent Office re: related application, date unknown.

* cited by examiner

*Primary Examiner*—Mark Budd
(74) *Attorney, Agent, or Firm*—Harness, Dickey & Pierce, P.L.C.

(57) ABSTRACT

A piezoelectric resonator element is provided including a base portion and a plurality of resonating arms extending from the base portion. A notch part is formed in the base portion. Grooves are formed in the front and back surfaces of the resonating arms. A driving electrode is provided at least in the grooves of the resonating arms. The driving electrode has a lower layer and an electrode layer formed on the lower layer. The thickness t of the lower layer is in the range $0.07 < t < 0.3$ micrometers.

9 Claims, 12 Drawing Sheets

B-B SECTION

B-B SECTION

C-C SECTION

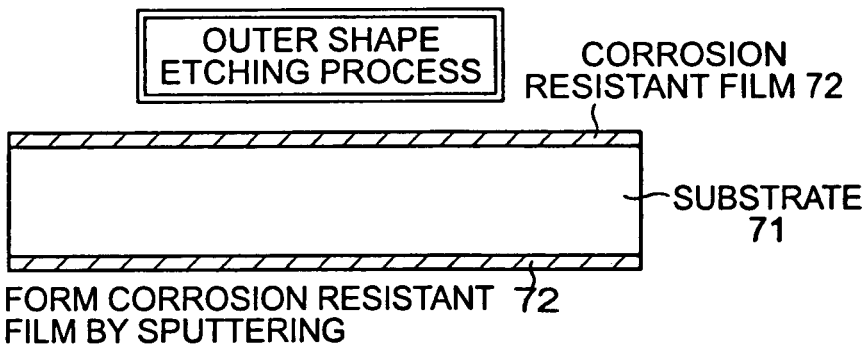
FIG. 7A
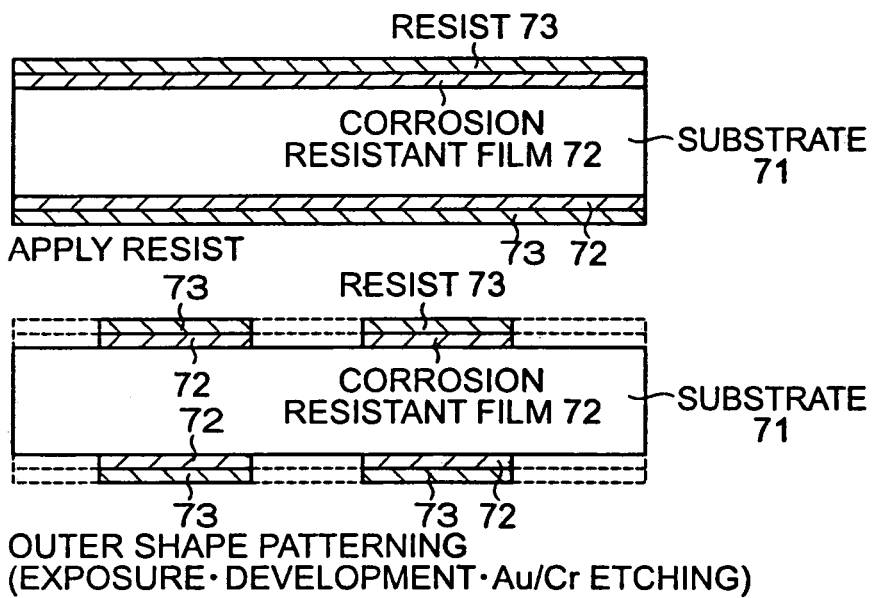
FIG. 7B
FIG. 7C
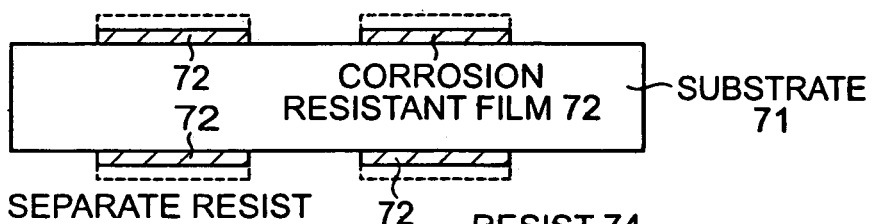
FIG. 7D
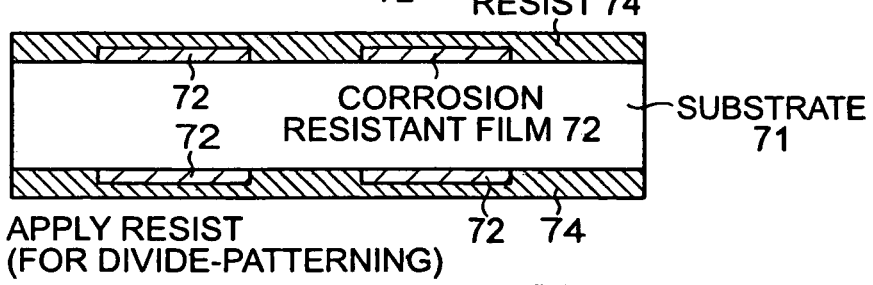
FIG. 7E
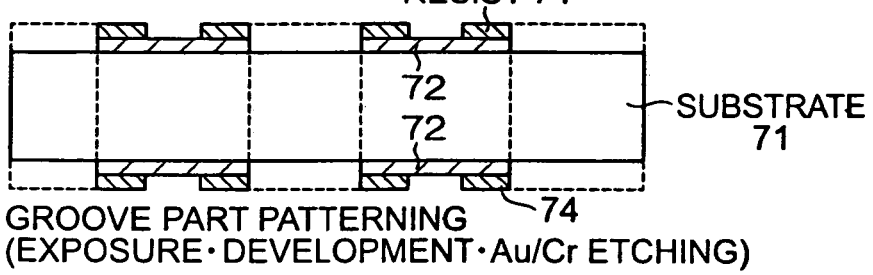
FIG. 7F SEPARATE Au/Cr FILM

ELECTRODE FORMING PROCESS

Au/Cr SPUTTERING

APPLY RESIST FILM

PIEZOELECTRIC RESONATOR ELEMENT, PIEZOELECTRIC DEVICE, METHOD OF MANUFACTURING THE SAME, CELLULAR PHONE DEVICE UTILIZING PIEZOELECTRIC DEVICE, AND ELECTRONIC EQUIPMENT UTILIZING PIEZOELECTRIC DEVICE

RELATED APPLICATIONS

This application claims priority to Japanese Patent Application No. 2003-367743 filed Oct. 28, 2003 which is hereby expressly incorporated by reference herein in its entirety.

BACKGROUND

1. Field of the Invention

The present invention relates to a piezoelectric resonator element, a piezoelectric device, a method of manufacturing them, a cellular phone, and electronic equipment that utilize a piezoelectric device.

2. Related Art

In small information equipment such as a hard disc drive (HDD), a mobile computer, or an integrated circuit (IC) card, and mobile communication equipment such as a cellular phone, a car-phone, or a paging system, a piezoelectric device such as a crystal resonator and a crystal oscillator that contains a piezoelectric resonator element in a package has been widely used.

A piezoelectric resonator element contained in a conventional piezoelectric device has a structure including a base portion and a pair of resonating arm portions formed in a manner of protruding from the base portion (Refer to Japanese Unexamined Patent Publication No. 2002-261575 (FIG. 1, Page 5 and 7)).

Groove parts are formed on both of the front and back surfaces of resonating arm parts of the conventional piezoelectric resonator element, while notch parts are formed in the base portion.

However, in a tuning fork type resonator element with so-called grooves, which is a conventional piezoelectric resonator element, a temperature characteristic (frequency) that is the relationship between temperature changes and frequency tolerance changes shows a quadratic curve. Therefore, there is a problem that the changes of frequency tolerance due to temperature changes become large.

The present invention is devised in order to solve the above problem, and is intended to provide a piezoelectric resonator element, a piezoelectric device in which the changes of frequency tolerance in response to temperature changes is reduced so as to obtain an excellent temperature characteristic, a method of manufacturing them, a cellular phone device utilizing a piezoelectric device, and electronic equipment utilizing a piezoelectric device.

SUMMARY

According to a first aspect of the invention, the above aim is achieved by a piezoelectric resonator element comprising: a base portion; and a plurality of resonating arms extending from the base portion parallel to the base portion, wherein: a notch part is formed in the base portion, and a groove part is formed on a front surface and a back surface of the resonating arms; an electrode for driving is provided at least in the groove part of the resonating arms; and the electrode for driving has a lower layer and an electrode layer formed on the lower layer, and the thickness t of the lower layer is in the range 0.07 micrometers<t<0.3 micrometers.

According to the configuration of the first aspect, a notch part is formed in a base portion. A groove part is formed on the front and back surface parts of resonating arms.

The thickness t of the lower layer of the electrode for driving is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

In a second aspect of the invention, the lower layer is composed of chromium, and the electrode layer is composed of gold in the configuration of the first aspect.

According to the configuration of the second aspect, the lower layer is composed of Cr, and the electrode layer is composed of Au.

Thus, since Cr is used for the lower layer and a Cr film is appropriate for the lower layer of a piezoelectric resonator element, the temperature characteristic is improved because of the effect of stress caused by forming of the Cr film.

In a third aspect of the invention, the thickness t of the lower layer is in the range 0.07 micrometers<t<0.15 micrometers in the configuration of the first or second aspect.

According to the configuration of the third aspect, the thickness t of the lower layer is preferably in the range 0.07 micrometers<t<0.15 micrometers. If the thickness t of the lower layer is 0.07 micrometers or less, in the working temperature range in the view of practical use, the changes of frequency tolerance in response to temperature changes become large. Furthermore, if the thickness t of the lower layer is 0.15 micrometers or more, side etching against the lower layer is easily caused when forming an electrode pattern by etching, and thus the degree of side etching may surpass the practical use level in which the patterning of the lower layer when etching is carried out sharply.

In a fourth aspect of the invention, the thickness t of the lower layer is in the range 0.09 micrometers<t<0.11 micrometers in the configuration of the first or second aspect.

According to the configuration of the fourth aspect, the thickness t of the lower layer is most preferably in the range 0.09 micrometers<t<0.11 micrometers. If the thickness t of the lower layer is 0.09 micrometers or less, frequency fluctuation may be slightly caused in the range of practical use temperatures. Furthermore, if the thickness t of the lower layer is 0.11 micrometers or more, side etching against the lower layer is easily caused when forming an electrode pattern by etching, and thus it may become hard to form the sharp pattern of the lower layer when etching.

According to a fifth aspect of the invention, the above aim is achieved by a piezoelectric device comprising: a piezoelectric resonator element contained in a package, wherein: the piezoelectric resonator element comprises a base portion and a plurality of resonating arms extending from the base portion parallel to the base portion; a notch part is formed in the base portion, and a groove part is formed on a front surface and a back surface of the resonating arms; an electrode for driving is provided at least in the groove part of the resonating arms; and the electrode for driving has a lower layer and an electrode layer formed on the lower layer, and the thickness t of the lower layer is in the range 0.07 micrometers<t<0.3 micrometers.

According to the configuration of the fifth aspect, a notch part is formed in a base portion. A groove part is formed on the front and back surface parts of resonating arms.

The thickness t of the lower layer of the electrode for driving is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

According to a sixth aspect of the invention, the above aim is achieved by a method of manufacturing a piezoelectric resonator element including a base portion, a plurality of resonating arms extending from the base portion parallel to the base portion, a notch part in the base portion, a groove part on a front surface and a back surface of the resonating arms, and an electrode for driving provided at least in the groove part, the method comprising: an outer shape etching step for etching a substrate composed of a piezoelectric material so as to form an outer shape; an electrode forming step for, after forming of the outer shape, forming the electrode for driving that has a lower layer and an electrode layer at least in the groove part of the resonating arms, wherein, in the electrode forming step, the lower layer is formed so that the thickness t of the lower layer is in the range 0.07 micrometers<t<0.3 micrometers.

According to the configuration of the sixth aspect, in the outer shape etching process, the outer shape is formed by etching a substrate composed of a piezoelectric material.

In the electrode forming step, after the outer shape is formed, the electrode for driving that has the lower layer and the electrode layer is formed at least in the groove part of the resonating arm.

In the electrode forming process, the thickness t of the lower layer is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

According to a seventh aspect of the invention, the above aim is achieved by a method of manufacturing a piezoelectric device containing, in a package, a piezoelectric resonator element that includes a base portion, a plurality of resonating arms extending from the base portion parallel to the base portion, a notch part in the base portion, a groove part on a front surface and a back surface of the resonating arms, and an electrode for driving provided at least in the groove part, the method comprising: an outer shape etching step for etching a substrate composed of a piezoelectric material so as to form an outer shape; an electrode forming step for, after forming of the outer shape, forming the electrode for driving that has a lower layer and an electrode layer at least in the groove part of the resonating arms, wherein, in the electrode forming step, the lower layer is formed so that the thickness t of the lower layer is in the range 0.07 micrometers<t<0.3 micrometers.

According to the configuration of the seventh aspect, in the outer shape etching process, the outer shape is formed by etching a substrate composed of a piezoelectric material.

In the electrode forming step, after the outer shape is formed, the electrode for driving that has the lower layer and the electrode layer is formed at least in the groove part of the resonating arm.

In the electrode forming process, the thickness t of the lower layer is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

According to an eighth aspect of the invention, the above aim is achieved by a cellular phone device obtaining a clock signal for control by using a piezoelectric device, comprising: a piezoelectric resonator element contained in a package of the piezoelectric device, wherein: the piezoelectric resonator element comprises a base portion and a plurality of resonating arms extending from the base portion parallel to the base portion; a notch part is formed in the base portion, and a groove part is formed on a front surface and a back surface of the resonating arms; an electrode for driving is provided at least in the groove part of the resonating arms; and the electrode for driving has a lower layer and an electrode layer formed on the lower layer, and the thickness t of the lower layer is in the range 0.07 micrometers<t<0.3 micrometers.

According to the configuration of the eighth aspect, a notch part is formed in a base portion. A groove part is formed on the front and back surface parts of the resonating arms.

The thickness t of the lower layer of the electrode for driving is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

According to a ninth aspect of the invention, the above aim is achieved by electronic equipment obtaining a clock signal for control by using a piezoelectric device, comprising: a piezoelectric resonator element contained in a package of the piezoelectric device, wherein: the piezoelectric resonator element comprises a base portion and a plurality of resonating arms extending from the base portion parallel to the base portion; a notch part is formed in the base portion, and a groove part is formed on a front surface and a back surface of the resonating arms; an electrode for driving is provided at least in the groove part of the resonating arms; and the electrode for driving has a lower layer and an electrode layer formed on the lower layer, and the thickness t of the lower layer is in the range 0.07 micrometers<t<0.3 micrometers.

According to the configuration of the ninth aspect, a notch part is formed in a base portion. A groove part is formed on the front and back surface parts of resonating arms.

The thickness t of the lower layer of the electrode for driving is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

BRIEF DESCRIPTION OF THE DRAWINGS

FIGS. 7A through 7F are schematic process diagrams showing, in order, the manufacturing processes of a piezoelectric resonator element contained in the piezoelectric device of FIG. 1.

DETAILED DESCRIPTION

Preferred embodiments of the present invention will be described below with reference to the drawings.

Figure 1:
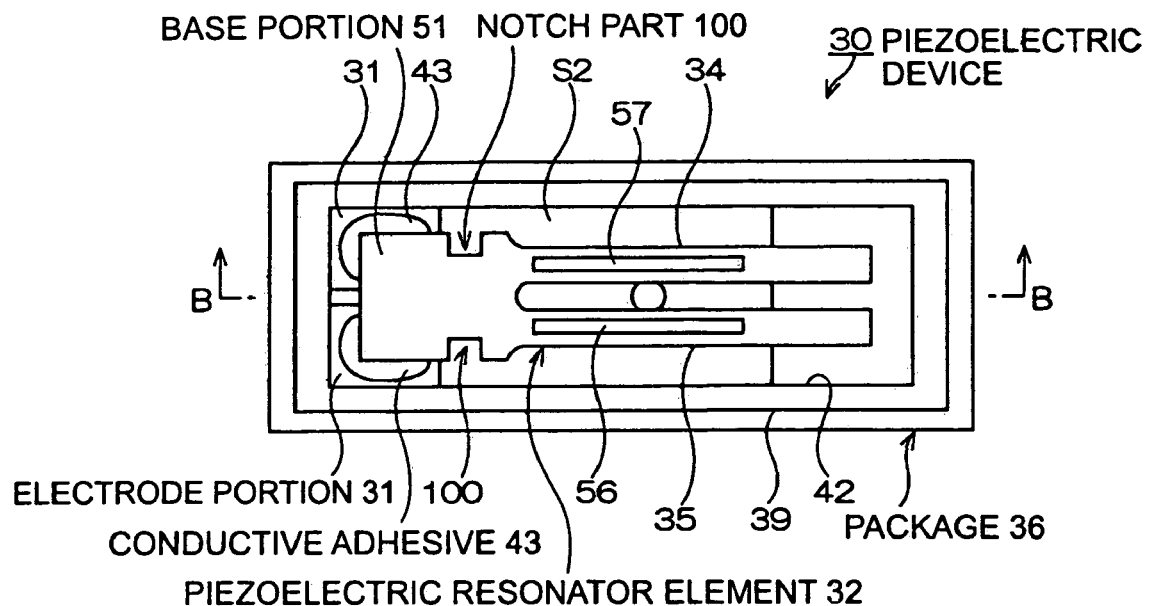
FIG. 1 is a schematic plain view showing an embodiment of a piezoelectric device of the present invention.
Figure 2:
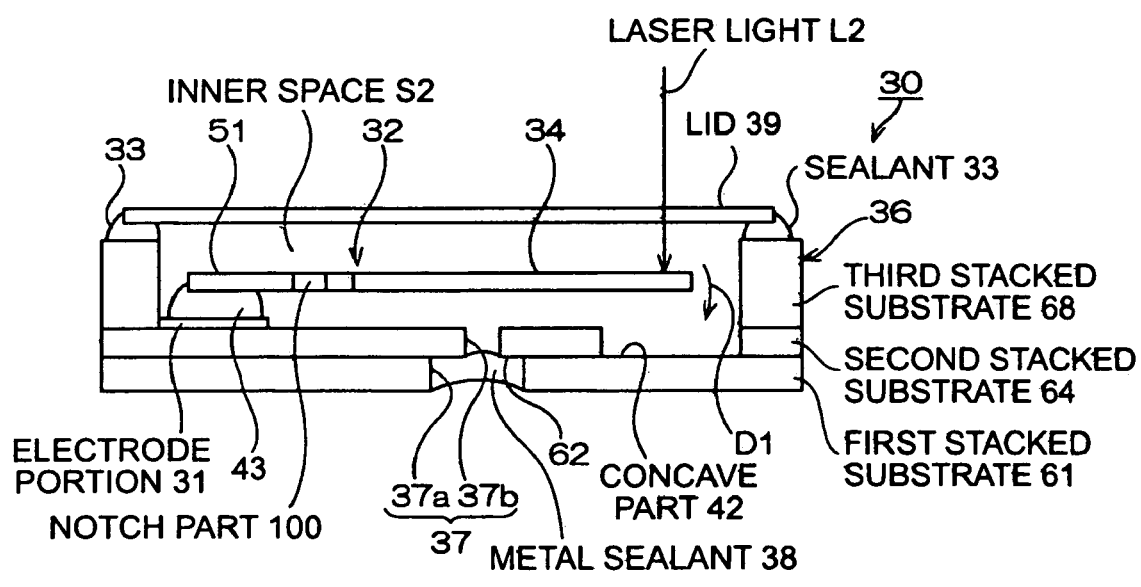
FIG. 2 is a schematic sectional view along B-B line of FIG. 1.

FIGS. 1 and 2 show an embodiment of a piezoelectric device of the present invention. FIG. 1 is a schematic plain view thereof, and FIG. 2 is a schematic sectional view along B-B line of FIG. 1.

Referring to FIGS. 1 and 2, in a piezoelectric device 30, an example in which a crystal resonator is constituted is shown. The piezoelectric device 30 contains a piezoelectric resonator element 32 in a package 36. The package 36 is formed by stacking a plurality of substrates formed by shaping ceramic green sheets composed of aluminum oxide as an insulating material, and then sintering it, for example. A given hole is formed inside each of the plurality of substrates in order to form a given inner space S2 inside when stacked.

This inner space S2 is a housing space to house the piezoelectric resonator element.

Namely, as shown in FIG. 2, in this embodiment, the package 36 is formed by stacking a first stacked substrate 61, a second stacked substrate 64, and a third stacked substrate 68 from the bottom, for example.

Near the left end part in the diagram of the inner space S2 of the package 36, on the second stacked substrate 64, which is exposed to the inner space S2 and constitutes the inner bottom part, the electrode portions 31 and 31 formed by implementing nickel-plating or gold-plating for a tungsten metalized portion are provided, for example.

These electrode portions 31 and 31 are coupled to the outside so as to provide a driving voltage. Conductive adhesives 43 and 43 are applied onto the electrode portions 31 and 31, and a base portion 51 of the piezoelectric resonator element 32 is disposed on the conductive adhesives 43 and 43. Then, the conductive adhesives 43 and 43 are cured. As the conductive adhesives 43 and 43, an adhesive in which conductive particles such as silver fine particles are included in a synthetic resin agent as an adhesive component exerting adhesiveness can be used, and a silicone, epoxy, polyimide conductive adhesive or the like can be utilized.

The piezoelectric resonator element 32 shown in FIGS. 1 and 2 is formed by etching a quartz crystal, for example, as a piezoelectric material through manufacturing processes to be described later. In the present embodiment, the piezoelectric resonator element 32 is formed into the shape shown by a schematic perspective view of FIG. 3 particularly in order to obtain required performance with a small form.

Figure 3:
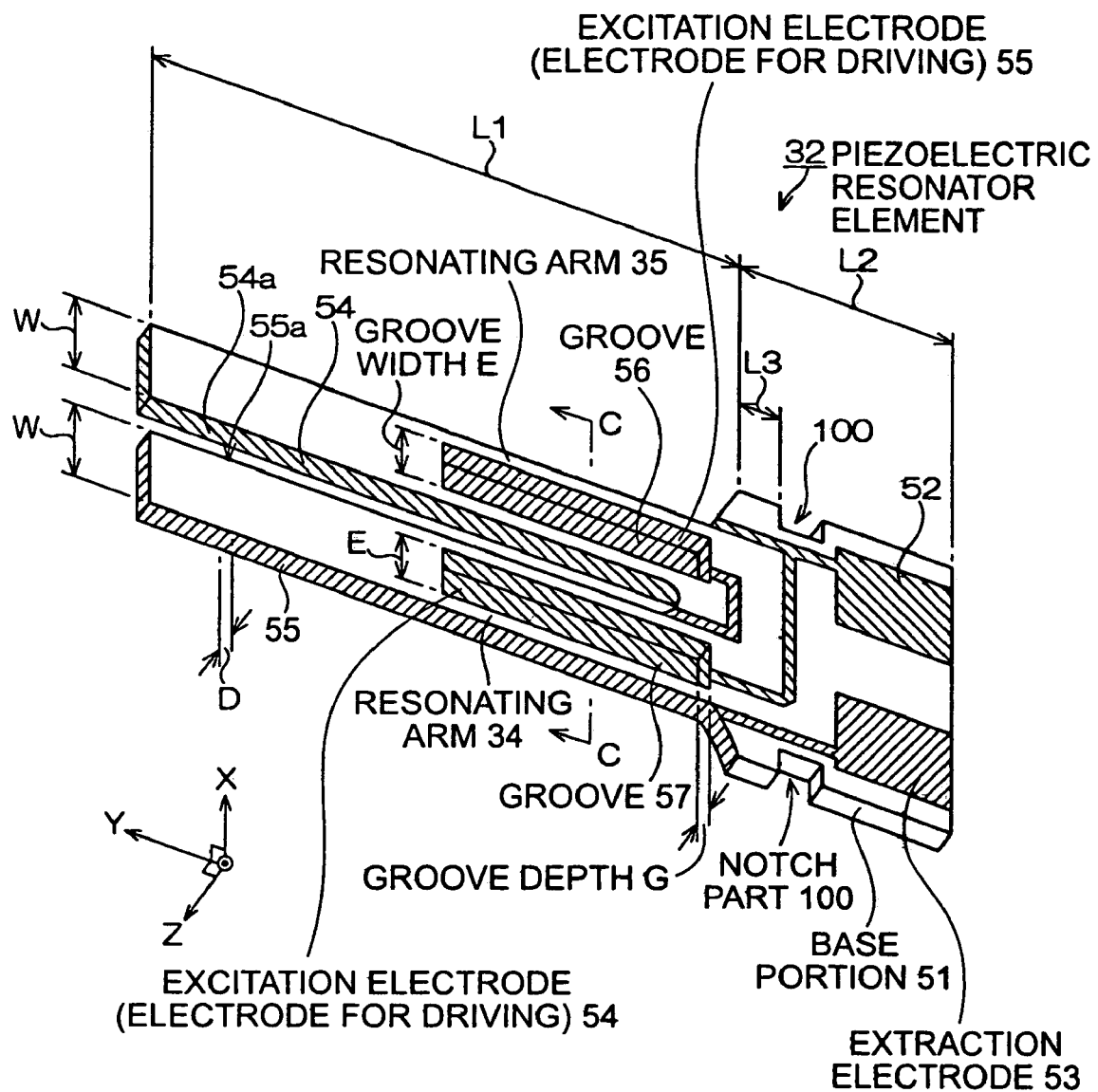
FIG. 3 is a schematic perspective view of a piezoelectric resonator element contained in a package of the piezoelectric device of FIG. 1.

The piezoelectric resonator element 32 of FIG. 3 comprises the base portion 51 fixed to the package 36 shown in FIGS. 1 and 2, and a pair of resonating arms 34 and 35 that extend from the base portion 51 as a base end toward the left in the drawing parallel to the Y direction in a manner of being bifurcated. As the piezoelectric resonator element 32, a so-called tuning fork type piezoelectric resonator element, whose entire shape is like a tuning fork, is utilized. The pair of resonating arms 34 and 35 is an example of a plurality of resonating arms.

Figure 4:
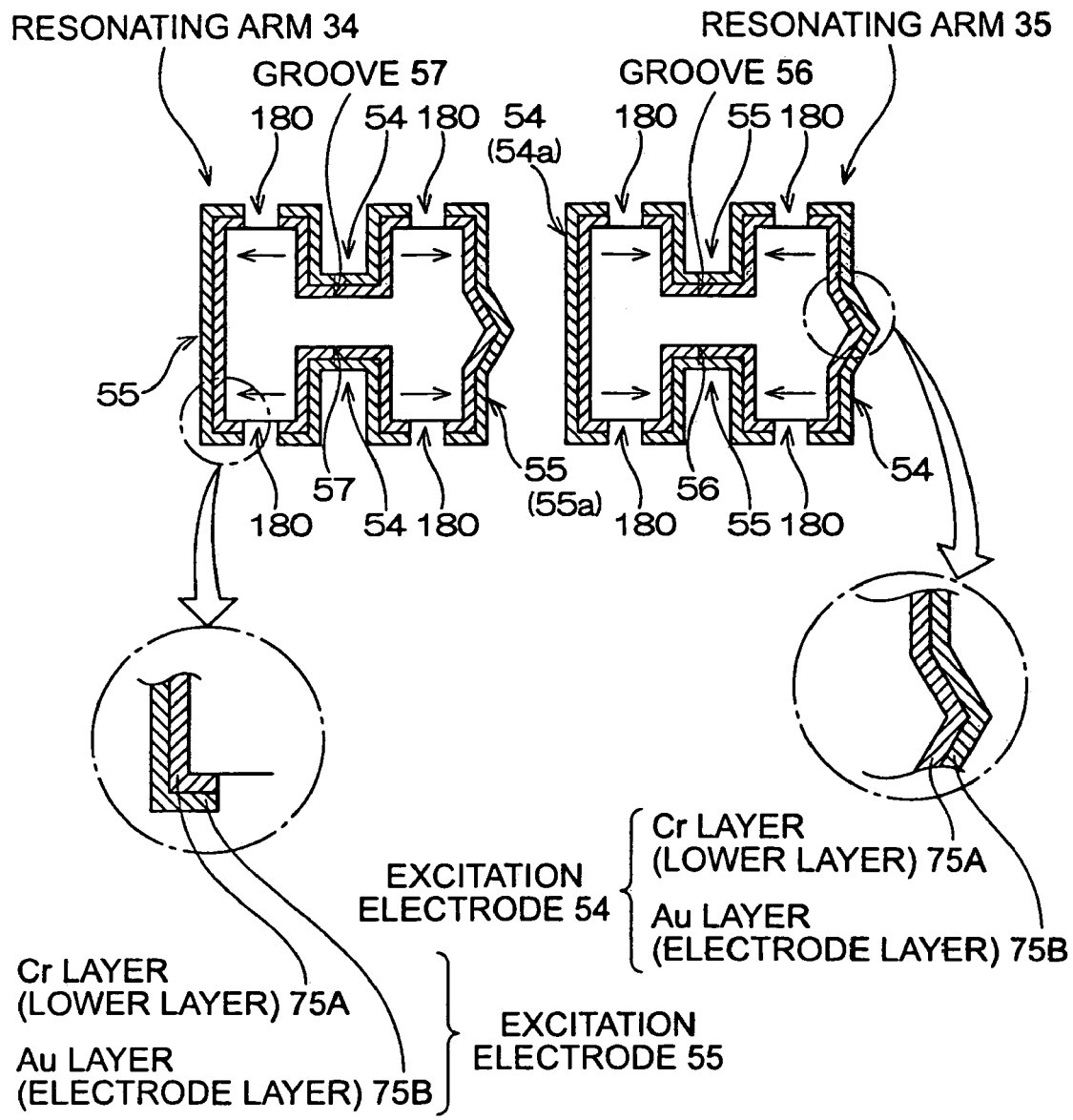
FIG. 4 is a cut sectional view along C-C line of FIG. 3.

In each of the resonating arms 34 and 35 of the piezoelectric resonator element 32 shown in FIG. 3, long bottomed grooves 56 and 57 extending along the length direction (Y-direction) are formed. The grooves 56 and 57 are formed on both sides of the front and back surfaces of the resonating arms 34 and 35, as shown in FIG. 4, which is an end surface view cut along C-C line of FIG. 3. The resonating arms 34 and 35 have a substantially H-shaped section.

Referring to FIG. 3, near both ends in the width direction at the end part (right end part in FIG. 3) of the base portion 51 of the piezoelectric resonator element 32, extraction electrodes 52 and 53 are formed. The extraction electrodes 52 and 53 are also formed on the back surface (not shown) of the base portion 51 of the piezoelectric resonator element 32 similarly.

These extraction electrodes 52 and 53 are portions connected to the electrode portions 31 and 31 on the package side shown in FIG. 1 with the conductive adhesives 43 and 43 as described above. The extraction electrodes 52 and 53 are electrically coupled to excitation electrodes (electrodes for driving) 54 and 55 provided in the grooves 56 and 57 of the resonating arms 34 and 35 as shown in the drawing.

The excitation electrodes 54 and 55 are also formed on both side surfaces of the resonating arms 34 and 35 as shown in FIG. 4. For example, with respect to the resonating arm 34, the polarity of the excitation electrode 54 in the groove 57 and that of the excitation electrode 55 on the side surface part are different from each other. With respect to the resonating arm 35, the polarity of the excitation electrode 55 in the groove 56 and that of the excitation electrode 54 on the side surface part are different from each other.

As is apparent from FIGS. 3 and 4, the polarities of side electrode portions 54a and 55a formed on the inner side surfaces of the resonating arms 34 and 35 that face each other are different from each other.

The piezoelectric resonator element 32 shown in FIG. 3 is formed of a quartz crystal that oscillates at substantially 30 kHz or substantially 40 kHz, for example.

Here, a size example with respect to the shape of the miniaturized piezoelectric resonator element 32 shown in FIG. 3 will now be described.

Length L1 in the longitudinal direction of the pair of resonating arms 34 and 35 shown in FIG. 3 is 1.644 millimeters, for example. Length L2 of the base portion 51 with respect to the Y-direction is 0.56 millimeters.

The base portion 51 has notch parts 100 and 100 on both sides thereof Length L3 from the notch part 100 to the vicinity of the other end part of the base portion 51 is 0.113 millimeters, for example.

Width W of the resonating arms 34 and 35 shown in FIG. 3 is preferably from 50 micrometers to 150 micrometers.

Width W of the resonating arms 34 and 35 is 0.1 millimeters, for example. Depth D of the resonating arms 34 and 35 is 0.1 millimeters, for example.

Groove width E of the grooves 56 and 57 in FIG. 3 is equal to or greater than 40% of the width W of the resonating arms 35 and 34. Groove depth G of the grooves 56 and 57 is equal to or greater than 30% and less than 50% with respect to the depth D of the resonating arms 34 and 35. That the groove width E is preferably equal to or greater than 40% of the width W of the resonating arm is a condition for reducing the rigidity of the resonating arms 34 and 35.

That the groove depth G is preferably equal to or greater than 30% and less than 50% of the depth D of the resonating arms 34 and 35 is a condition for reducing the rigidity of the resonating arms 34 and 35. If the groove depth G is 50% or more, the groove on the front surface side and the groove on the back surface side lead to each other.

In order to reduce the rigidity of the resonating arms 35 and 34, the grooves 56 and 57 in FIG. 3 are provided in the resonating arms 35 and 34.

As described above, the notch parts 100 and 100 shown in FIG. 3 are provided in one end part and the other end part of the base portion 51. It has been known that the temperature characteristic curve becomes straight instead of becoming a quadratic curve if the notch parts 100 and 100 are not provided in the base portion 51, and the existence of the notch part 100 prevents the temperature characteristic curve from becoming straight.

As the reason for this, it has been considered that, if there is no notch part 100, on the part in which the base portion 51 is mounted above the electrode portion 31 by using the conductive adhesive 43 as shown in FIG. 2, stress affects the resonating arms 35 and 34 so as to have an influence on the oscillation mode (oscillation characteristic).

As shown in FIG. 2, around substantially the center of the bottom surface of the package 36, successive through holes 37a and 37b are formed in two stacked substrates constituting the package 36, and thereby a through hole 37 opened outward is formed. Of two through holes constituting the through hole 37, compared to the first hole 37b opened to the inside of the package, the outside through hole 37a, which is the second hole, has the larger inside diameter. Thus, the through hole 37 is a stepped opening having a downward step part 62 in FIG. 2. On the surface of the step part 62, a metal-covered portion is preferably provided.

As a metal sealant 38 provided in the through hole 37, for example, a sealant not including lead is preferably selected. For example, it is selected from silver solder, Au/Sn alloy, Au/Ge alloy, and so forth. Corresponding to this, on the metal-covered part of surface of the stepped part 62, nickel-plating or gold-plating is preferably formed on a tungsten metalized portion.

For the opened upper end of the package 36, a lid 39 is bonded with a sealant 33 so as to carry out sealing. The lid 39 is preferably formed of a material that transmits light, particularly thin plate glass. This is because, after the lid 39 is sealingly fixed to the package 36, a metal-covered portion to be described later of the piezoelectric resonator element 32 is irradiated with laser light L2 from the outside so as to control the frequency by a mass reduction method as shown in FIG. 2.

As a glass material appropriate for the lid 39, for example, borosilicate glass is used as thin plate glass fabricated by a downdraw method for example.

Furthermore, in FIG. 2, by removing part of inside of the second substrate 64, a concave part 42 is formed. Thus, even if the tip of the piezoelectric resonator element 32 is displaced toward the arrowhead D1 direction when an external impact is given to the piezoelectric device 30, the tip of the piezoelectric resonator element 32 is prevented from colliding with the inside bottom part of the package 36 and being broken, effectively.

Next, a structural example of the excitation electrodes 54 and 55 will be described with reference to FIGS. 3 and 4.

FIG. 4 shows a structural example of an end surface along C-C line of the piezoelectric resonator element 32 shown in FIG. 3. Namely, the end surface of the resonating arms 34 and 35 shown in FIG. 4 is on a plane formed by the X-direction and Z-direction in FIG. 3.

As shown in FIG. 3, the excitation electrodes 54 and 55 are electrodes for driving and are provided at least in the grooves (one example of groove part) 56 and 57.

As described above, the polarities of the excitation electrodes 54 and 55 shown in FIGS. 3 and 4 are electrically different from each other.

The excitation electrodes 54 and 55 are a stacked structure of a lower layer 75A and an electrode layer 75B. The lower layer 75A is a Cr layer for example. The electrode layer 75B is an Au layer. The lower layer 75A may be a Ni layer or a Ti film instead of a Cr layer. The electrode layer 75B is not limited to an Au layer but may be an Ag layer.

The lower layer 75A of the excitation electrodes 54 and 55 shown in FIG. 4 is formed directly on the surface of the resonating arms 35 and 34. The electrode layer 75B is formed in a manner of being stacked on the lower layer 75A. Between the excitation electrode 54 and the other excitation electrode 55 of the resonating arm 34 shown in FIG. 4, a distance 180 for preventing a short-circuit is formed. Similarly, also between the excitation electrode 55 and the other excitation electrode 54 of the resonating arm 35, the distance 180 for preventing short-circuit is formed.

An oxide film such as $SiO_2$ is preferably provided around the distance 180 for preventing short-circuit, and thereby a short-circuit between the excitation electrodes 54 and 55 can surely be avoided. In the resonating arm 34, the excitation electrode 54 is formed on the groove 57 side, while the excitation electrode 55 is formed as the electrode on the side surface side. Similarly, in the resonating arm 35, the excitation electrode 55 is formed on the groove 56 side, while the excitation electrode 54 is formed as the electrode on the side surface side.

In the pair of resonating arms 34 and 35 shown in FIG. 4, electric fields are indicated by using arrowheads. When driving voltage is applied to the excitation electrodes 54 and 55, electric fields exemplified by arrowheads are caused in the resonating arms 34 and 35.

The present inventors have found a phenomenon in which the second order coefficient of the temperature characteristic becomes smaller as the thickness of the lower layer 75A, of the layered structure of the excitation electrodes 54 and 55 shown in FIG. 4, is increased.

Figure 5:
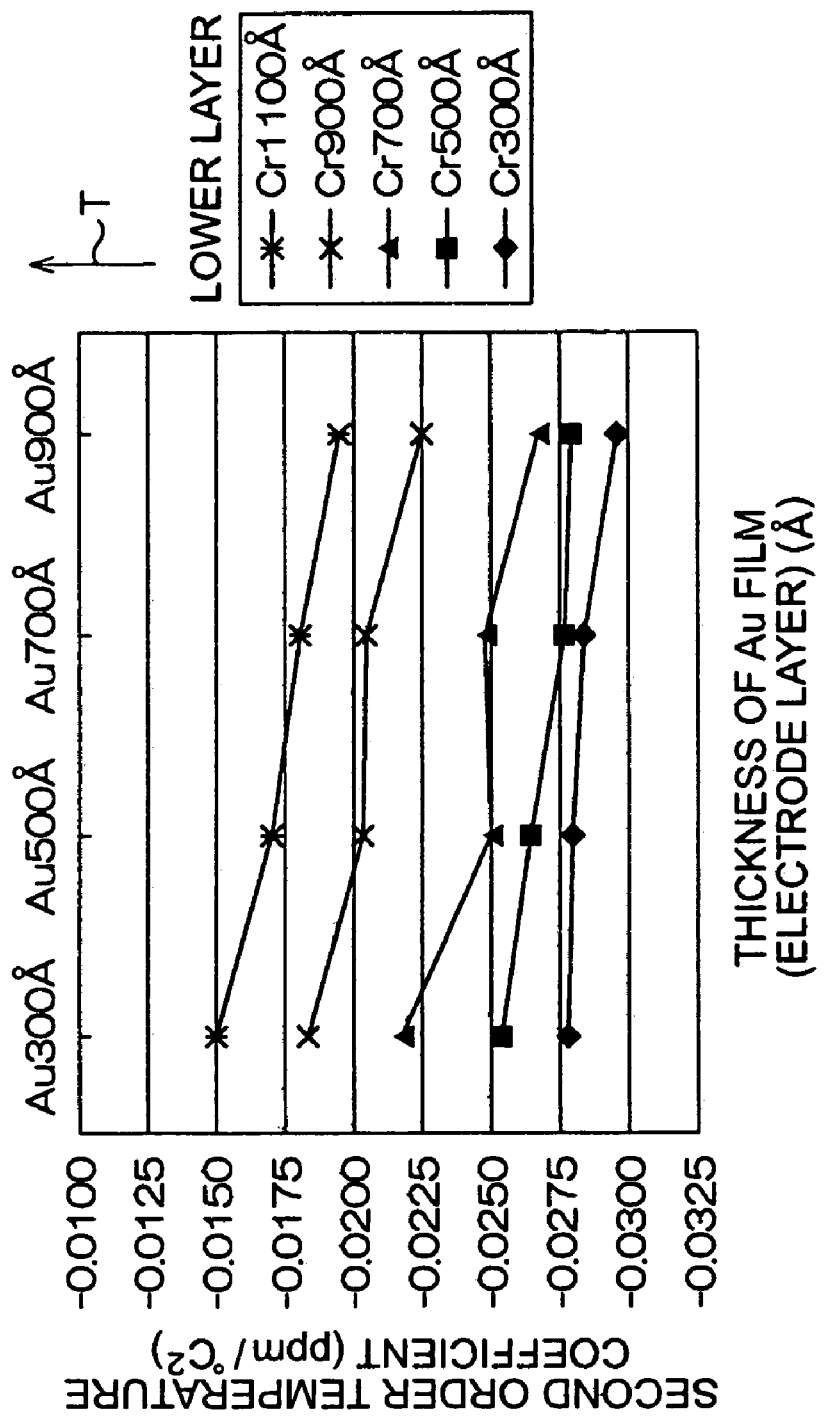
FIG. 5 is a diagram showing the relationship between electrode thickness and a temperature characteristic.

FIG. 5 shows an example of the relationship among the thickness of the electrode layer, the thickness of the lower layer, and the second order coefficient of the temperature characteristic.

Referring to FIG. 5, as the thickness of Cr, which is the lower layer, is increased, the value of second order temperature coefficient becomes smaller regardless of the thickness of the electrode layer (Au layer). Namely, the research in the present invention has revealed that the second order coefficient of temperature characteristic becomes smaller while advancing along the T-direction in FIG. 5, namely, as the thickness of chromium of the lower layer is increased.

Figure 6:
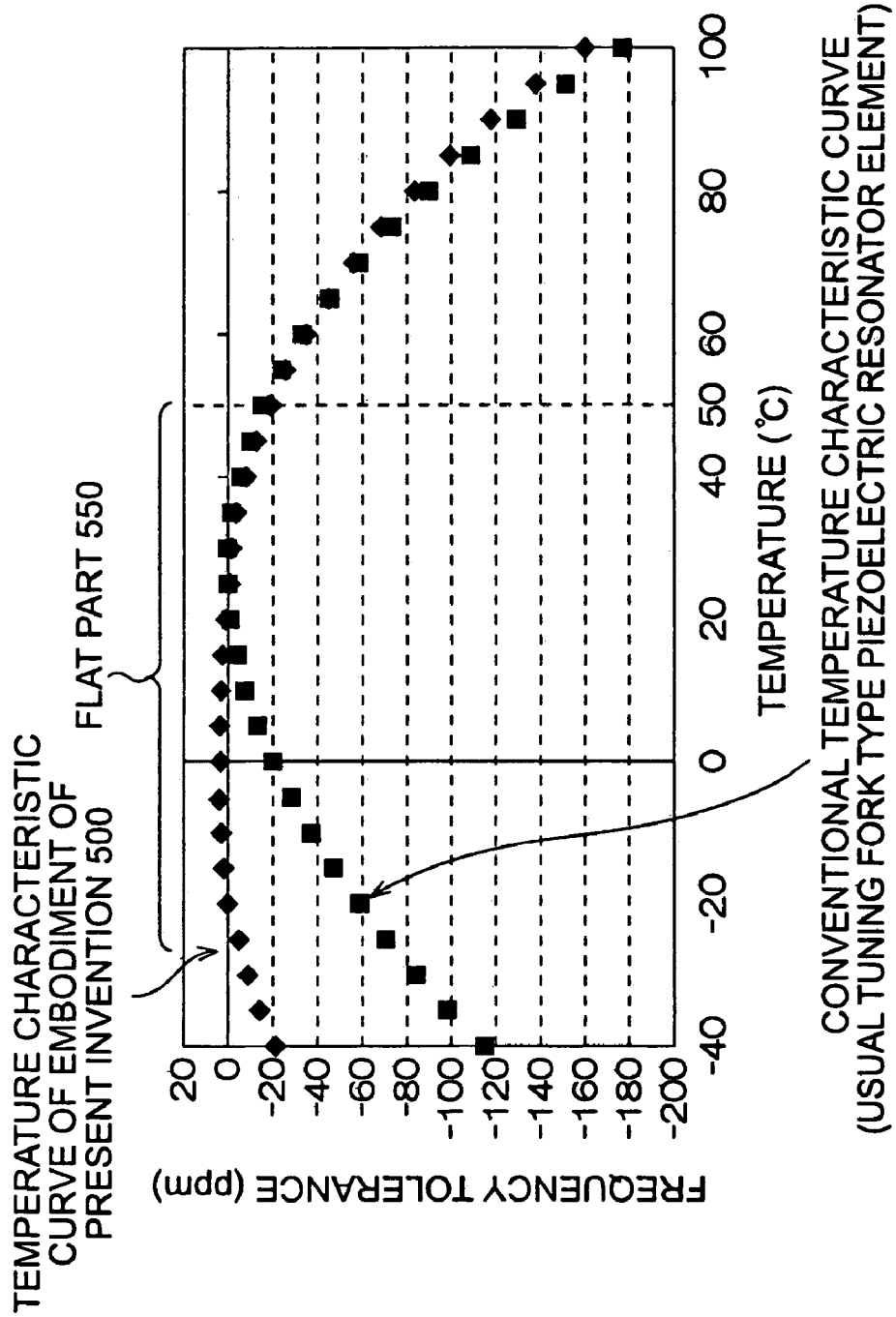
FIG. 6 is a diagram showing temperature characteristic curves of the embodiment of the present invention and a conventional example.

FIG. 6 shows an example of the temperature characteristic (frequency).

In FIG. 6, examples of a tuning fork type piezoelectric resonator element of the embodiment of the present invention and a conventional one are shown. The conventional tuning fork type piezoelectric resonator element indicates a quadratic temperature characteristic curve 400 that has a turnover temperature and is upwardly convex. The thickness t1 of chromium that is a lower layer in a conventional usual tuning fork type piezoelectric resonator element is in the range 300 angstrom<t1<700 angstrom. In the case of the temperature characteristic curve 400 shown in FIG. 6, the thickness t1 of chromium was 700 angstrom.

A temperature characteristic curve 500 from the piezoelectric resonator element of the embodiment of the present invention shown in FIG. 6 does not become a quadratic temperature characteristic curve, which is symmetrical, but includes a substantially flat part 550. The temperature characteristic curve 500 of the embodiment of the present invention became not a quadratic curve but a cubic curve. The temperature characteristic curve 500 was obtained when the thickness t of chromium was 900 angstrom. The flat part 550 in the temperature characteristic curve 500 of the embodiment of the present invention is in the temperature range from −20 degrees centigrade to 50 degrees centigrade, for example.

By obtaining the temperature characteristic curve 500 of the embodiment of the present invention that includes such a flat part 550, an accurate temperature characteristic curve in which the changes of frequency tolerance due to temperature changes are small can be obtained.

As shown in FIG. 5, for example, the value of the second order temperature coefficient when the film thickness of chromium of the lower layer is 900 angstrom (0.09 micrometers) for example, is substantially half as compared to the case in which the thickness of chromium is 300 angstrom.

In the present invention, the thickness t of the lower layer of the excitation electrodes 54 and 55 shown in FIG. 4 is in the range 0.07 micrometers<t<0.3 micrometers (700 angstrom<t<3000 angstrom).

Namely, the thickness t of the lower layer of the electrode for driving is in the range 0.07 micrometers<t<0.3 micrometers.

If the thickness t of the lower layer is 0.07 micrometers or less, in the working temperature range in the view of practical use, the changes of frequency tolerance in response to temperature changes become large. Moreover, if the thickness t of the lower layer is 0.3 micrometers or more, side etching by an etchant for the lower layer is intensely caused when forming an electrode pattern by etching, so that the patterning of electrodes with high accuracy becomes impossible.

Thus, since the thickness t of the lower layer is in the above range, the second order coefficient of the temperature characteristic curve is decreased considerably so that a flat part in the temperature characteristic is obtained. Therefore, the changes of frequency tolerance due to temperature changes can be reduced. Because the thickness t of the lower layer is large as described above, by forming electrodes for driving, stress is caused in the forming portion so as to affect the oscillation characteristic, and thus the temperature characteristic is improved.

Furthermore, in the present invention, the thickness t of the lower layer of the excitation electrodes 54 and 55 is preferably in the range 0.07 micrometers<t<0.15 micrometers (700 angstrom<t<1500 angstrom).

If the thickness t of the lower layer is 0.07 micrometers or less, in the working temperature range in the view of practical use, the changes of frequency tolerance in response to temperature changes become large. Furthermore, if the thickness t of the lower layer is 0.15 micrometers or more, side etching against the lower layer is easily caused when forming an electrode pattern by etching, and thus the degree of side etching may surpass the practical use level in which the patterning of the lower layer when etching is carried out sharply.

In the present invention, the thickness t of the lower layer of the excitation electrodes 54 and 55 is most preferably in the range 0.09 micrometers<t<0.11 micrometers (900 angstrom<t<1100 angstrom).

If the thickness t of the lower layer is 0.09 micrometers or less, frequency fluctuation may be caused slightly in the range of practical use temperatures. Furthermore, if the thickness t of the lower layer is 0.11 micrometers or more, side etching against the lower layer is easily caused when forming an electrode pattern by etching, and thus it may become hard to form the sharp pattern of the lower layer when etching.

In the flat part 550 in the temperature characteristic curve 500 of the embodiment of the present invention as shown in FIG. 6, the considerably flat shape is obtained around the turnover temperature in the temperature characteristic.

In order to obtain the flat shape, it is desirable that the thickness of metal thin film of the excitation electrode, particularly the thickness of chromium of the lower layer, is limited to the above range.

In an AT piezoelectric resonator element, among the structures of an excitation electrode, particularly the thickness of the lower layer and so forth has a significant effect. Meanwhile, in the tuning fork type piezoelectric resonator element of the present invention, the excitation electrode may not exist in an extreme case. It has not been considered that the thickness of the lower layer of the excitation electrode has an effect on the temperature characteristic curve of a piezoelectric resonator element.

As shown in FIG. 2, the base portion 51 of the piezoelectric resonator element is mounted with the conductive adhesive 43 such as Si-based Ag paste for example. Stress caused by this mounting seems to also affect the oscillation mode of the piezoelectric resonator element so as to affect the temperature characteristic. If the temperature moves toward the high temperature side or the low temperature side, the effect of stress by the conductive adhesive becomes significant. This seems to affect the temperature characteristic curve on the low temperature side. Even if the same Si-based conductive adhesive is used, the difference in the second order coefficient of the temperature characteristic curve is caused.

Since the notch parts 100 and 100 are formed in the base portion 51 as shown in FIG. 3, the crystal impedance (CI) value varies. It has been known that, since the notch part 100 is formed in the base portion 51, the existence of the notch part allows the temperature characteristic curve to become not straight but a quadratic curve so as to prevent the temperature characteristic curve from becoming straight. As the reason for this, it is considered that, if the notch part does not exist, stress of the mounted part affects the resonating arm so as to affect the oscillation mode.

The grooves 56 and 57 are formed in the resonating arms 34 and 35, and therefore the rigidity of the resonating arms 34 and 35 is reduced. Thus, the temperature characteristic curve 500 as shown in FIG. 6 is obtained. Since the groove depth G shown in FIG. 3 is set to be equal to or greater than 30% and less than 50% of the thickness of the resonating arm, the rigidity of the resonating arm is reduced so that the temperature characteristic curve 500 as shown in FIG. 6 can be obtained. The groove width E shown in FIG. 3 is set to be equal to or greater than 40% of the width W of the resonating arm. Thus, the rigidity is reduced, and thereby obtaining the temperature characteristic curve 500 shown in FIG. 6.

The frequency at which the piezoelectric resonator element 32 shown in FIG. 3 oscillates is substantially 30 kHz or 40 kHz. Thereby, the temperature characteristic curve 500 shown in FIG. 6 is obtained.

In the piezoelectric resonator element 32 with a so-called groove as the embodiment of the present invention, the film thickness of the electrode, particularly the thickness of the lower layer is controlled. Thus, the second order coefficient is considerably reduced in the temperature characteristic curve 500 as shown in FIG. 6 so that the flat part 550 can be obtained. This enables the changes of frequency tolerance due to temperature changes to be reduced, and therefore an accurate piezoelectric resonator element and piezoelectric device can be obtained.

Also in the Au layer, which is the electrode layer of the excitation electrode, a thinner Au film shows the trend toward a smaller second order coefficient in the temperature characteristic curve although the effect is less significant than that of chromium layer being the lower layer as shown in FIG. 5.

Moreover, in the piezoelectric resonator element of the present invention, practically, the Au film in the groove forming portion (important portion determining the oscillation mode and characteristic) is removed, and $SiO_2$ coating (insulator for preventing short-circuit between electrodes) is implemented therefore.

Next, FIGS. 7 through 10 are process diagrams for explaining one example of a method of manufacturing the piezoelectric resonator element 32 of the present embodiment. Each process of FIGS. 7 through 10 is shown in the order of processes with respect to a region corresponding to the cut surface of the resonating arms 34 and 35 that is shown with a cut end surface diagram of the part corresponding to FIG. 4.

FIGS. 7 through 9K show an outer shape etching process. FIGS. 9L through 10P show an electrode forming process.

One example of a method of manufacturing the piezoelectric resonator element 32 will be described with sequentially referring to FIGS. 7A through 7F. Next, one example of a method of manufacturing the piezoelectric device 30 will be described based on FIG. 11.

Referring to FIG. 7A, a substrate 71 composed of a piezoelectric material whose size is such that a plurality or a number of the piezoelectric resonator elements 32 can be obtained is prepared. The substrate 71 is cut from a piezoelectric material, for example a single crystal of a quartz crystal so that, when the substrate 71 is processed into the tuning fork type piezoelectric resonator element 32 through the processes, X, Y, and Z-axes shown in FIG. 3 become an electrical axis, a mechanical axis, and an optical axis, respectively. Also, when the substrate is cut from a single crystal of a quartz crystal, in the orthogonal coordinate system made up of the above X, Y, and Z-axes, the cutting is made with inclining the XY-plane constituted by X and Y-axes by about −5 degrees or 5 degrees clockwise around the X-axis.

Corrosion Resistant Film Forming Process

As shown in FIG. 7A, corrosion resistant films 72 are formed on the surfaces (front and back surfaces) of the substrate 71 with methods such as sputtering or vapor deposition. As shown in the drawing, the corrosion resistant films 72 are formed on both the front and back surfaces of the substrate 71 composed of a quartz crystal, and the corrosion resistant film 72 comprises, for example, a chromium layer as a lower layer and a gold covering layer that is provided thereon.

In the following processes, the same processing is carried out for both upper and lower surfaces of the substrate 71. Therefore, description will be made only for the upper layer in order to avoid complications.

Outer Shape Patterning Process

Then, as shown in FIG. 7B, resist 73 is applied on the entire surface of the corrosion resistant films 72 on the front and back of the substrate 71 (resist applying process). The resist 73 is applied in order to pattern the outer shape. As the resist 73, for example, ECA-based, or PGMEA-based positive resist can favorably be used.

Etching Process

Then, as shown in FIG. 7C, a mask (not shown) with given pattern width is disposed in order to pattern the outer shape and exposure is implemented. Thereafter, the exposed resist 73 is removed, and then the corrosion resistant films 72 are also removed in the order Au and Cr with corresponding to the part from which resist is removed.

Next, as shown in FIG. 7D, the part outside the outer shape of the piezoelectric resonator element 32 is exposed, and then resist 74 is applied on the entire surface as shown in FIG. 7E.

Next, as shown in FIG. 7F, the part outside the outer shape of the piezoelectric resonator element 32 and the resist 74 on the groove part of each resonating arm are removed.

Figure 8G:
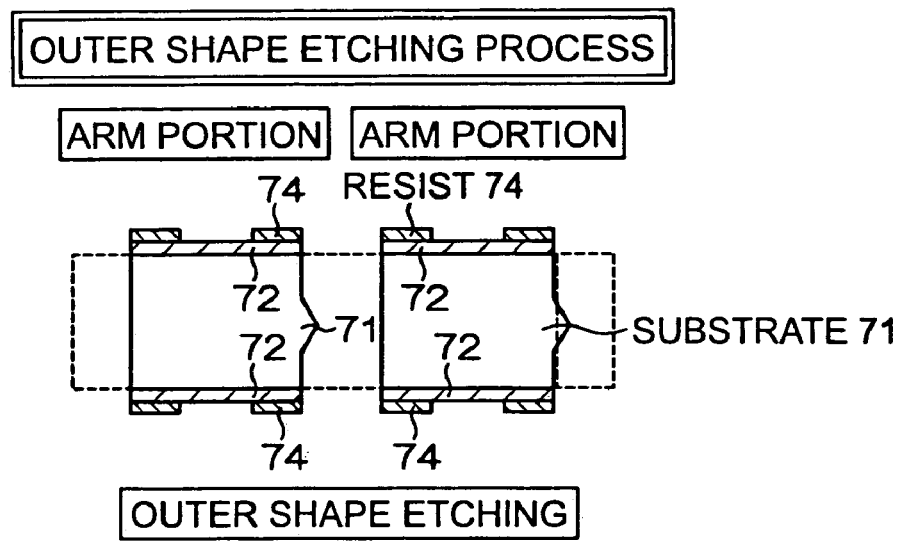
FIGS. 8G through 8J are schematic process diagrams showing, in order, the manufacturing processes of the piezoelectric resonator element contained in the piezoelectric device of FIG. 1.

Then, as shown in FIG. 8G, for the substrate 71 exposed as the part outside the outer shape of the piezoelectric resonator element 32, the outer shape of the piezoelectric resonator element is etched with using a hydrofluoric acid solution as an etchant, for example (etching process). The time required for the etching process is from 2 to 3 hours, and varies depending on the concentration, kind, temperature, and so forth of the hydrofluoric acid solution. In the embodiment, hydrofluoric acid and ammonium fluoride are used as the etchant. The volume ratio thereof as the concentration is 1:1, and the temperature thereof is 65±1 degrees centigrade. With these conditions, the etching process is completed in about two and a half hours.

Half Etching Process

Figure 8H:
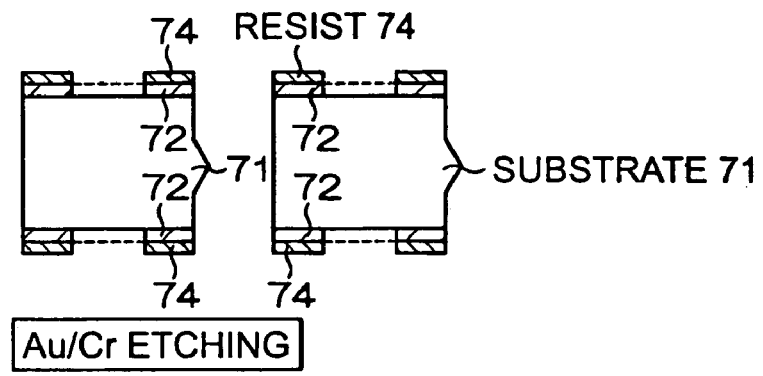

Next, as shown in FIG. 8H, the corrosion resistant films 72 on the groove part of the resonating arms are removed.

Figure 8I:
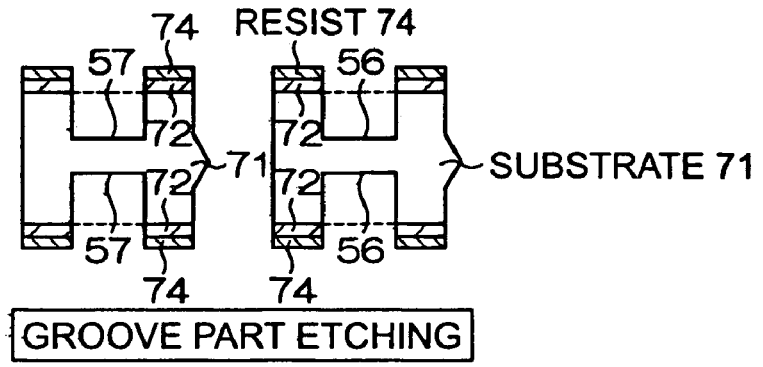

For the substrate 71 exposed by removing the corrosion resistant films 72 therefrom, as shown in FIG. 8I, half etching of the groove part of the resonating arm is implemented by using a hydrofluoric acid solution and so forth.

In the embodiment, hydrofluoric acid and ammonium fluoride are used as the etchant. The volume ratio thereof as the concentration is 1:1, and the temperature thereof is 65±1 degrees centigrade. With these conditions, the etching process is completed in 30-60 minutes.

Thus, the grooves 56 and 57 in the resonating arms 34 and 35 are formed.

Figure 8J:
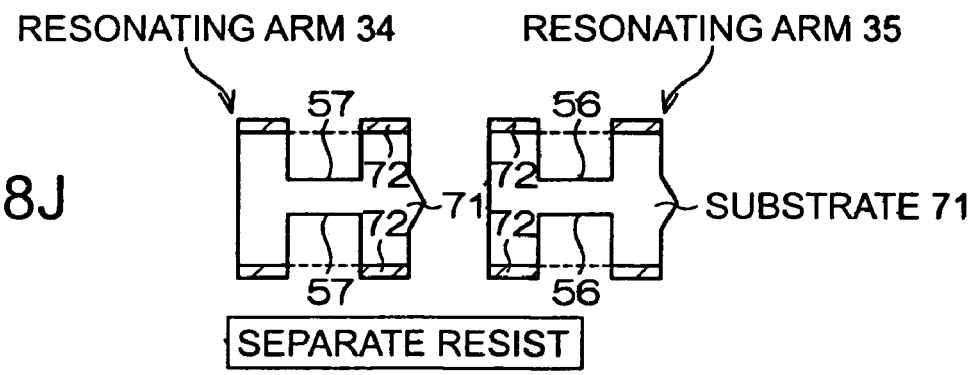
Figure 9K:
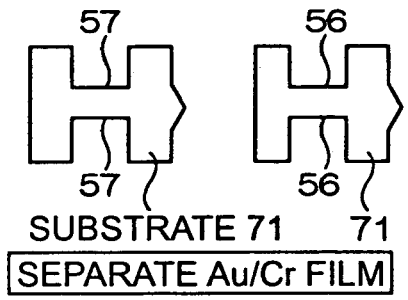
FIGS. 9K through 9M are schematic process diagrams showing, in order, the manufacturing processes of the piezoelectric resonator element contained in the piezoelectric device of FIG. 1.

Next, as shown in FIG. 8J, the resist 74 is removed from the corrosion resistant film 72, and the corrosion resistant film 72 is also removed so as to obtain a state of FIG. 9K. This is the state in which the electrodes of the piezoelectric resonator element 32 of FIG. 3 are not formed.

Figure 9L:
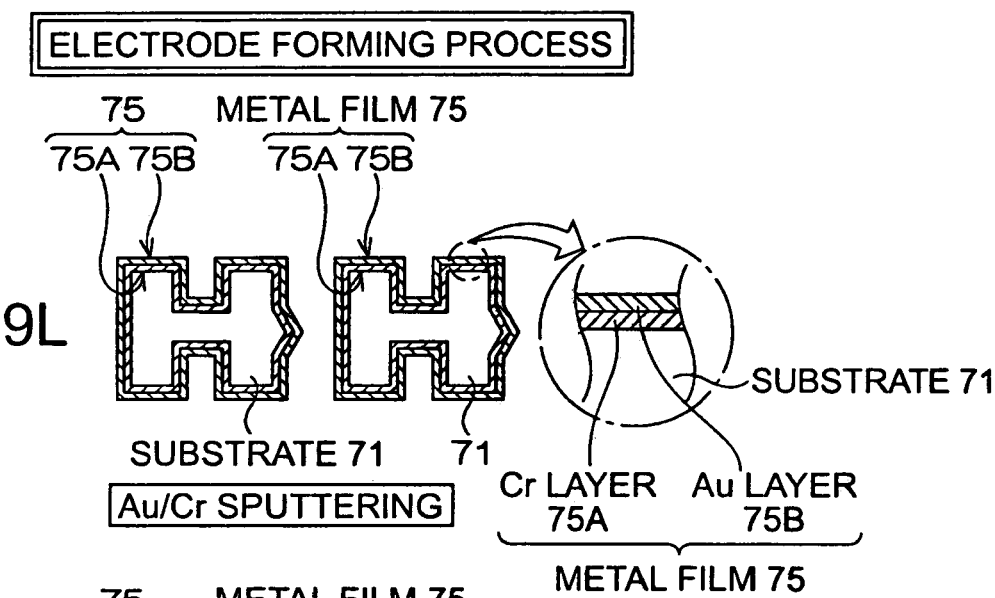

Subsequently, as shown in FIG. 9L, metal films 75 for forming electrodes on the entire surface are formed with methods such as vapor deposition or sputtering. The metal films 75 are made up of a chromium layer as the lower layer 75A, which is the same as the corrosion resistant film, and the electrode layer (gold covering layer) 75B provided thereon.

Electrode Film Forming Process

Resist Applying Process in Forming of Electrode

Figure 9M:
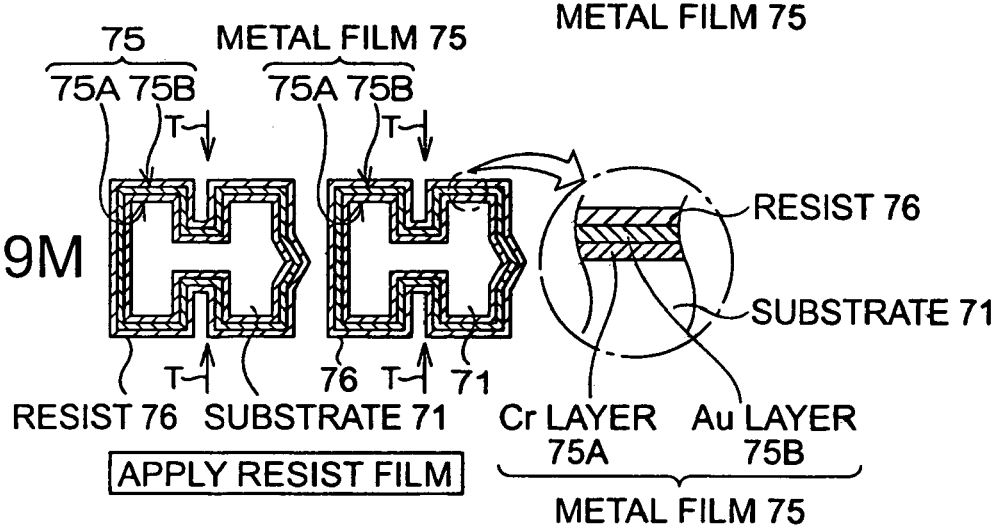

Next, as shown in FIG. 9M, resist 76 is ejected at an angle in which the ejecting orientation intersects the front and back surfaces of the substrate 71 as shown by arrowheads T, so as to be applied. In the embodiment, the resist 76 is so-called spray resist. The ejecting angle is about 90 degrees with respect to the front and back surfaces of the substrate 71.

As the resist 76, in view of the suitability for the manufacturing process of the present embodiment, a material diluted with a solvent of high volatility and adhering to the substrate 71 in a half-dried state is suitable. Specifically, ECA-based or PGMEA-based positive resist is used, for example, as a resist solution having the viscosity of about 5-40 cp. The number of ejecting is from 2 to 4 so that the resist thickness becomes from 1 micrometer to 3 micrometers.

Figure 10N:
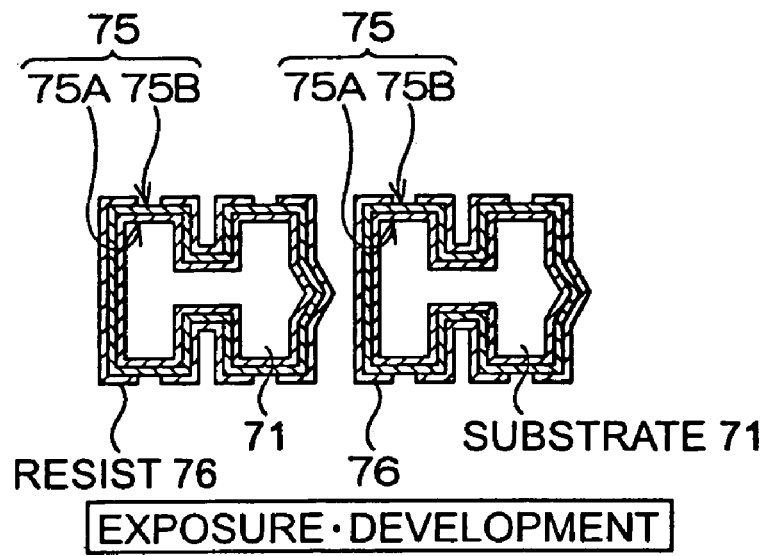
FIGS. 10N through 10P are schematic process diagrams showing, in order, the manufacturing processes of the piezoelectric resonator element contained in the piezoelectric device of FIG. 1.

In a state where the resist 76 is thus applied as shown in FIG. 9M, masking (not shown) for separating a region on which electrodes are formed (refer to FIG. 3) from the other region, and exposure are implemented as shown in FIG. 10N. Then, the unnecessary resist 76 is removed so as to expose the metal film 75 to be removed.

Figure 10O:
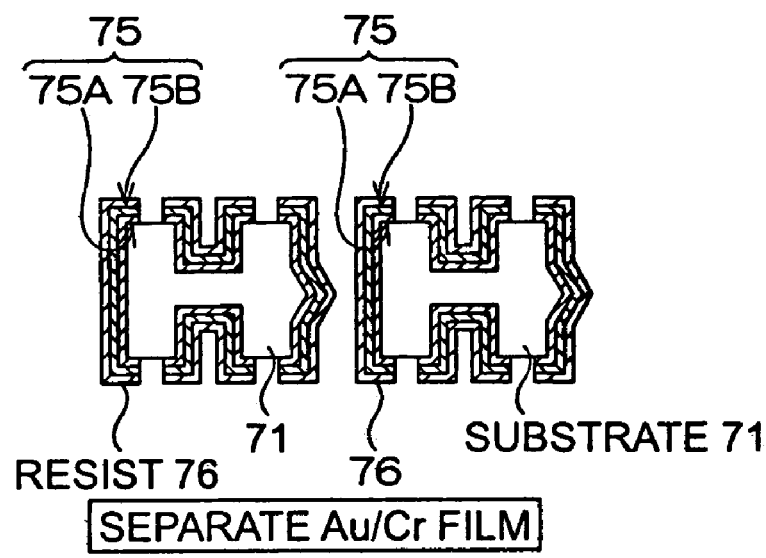

Then, as shown in FIG. 10O, the exposed metal film is removed by wet etching with using an etchant such as potassium iodide for example. Thereby, the metal films 75 to be removed are all removed by etching.

Figure 10P:
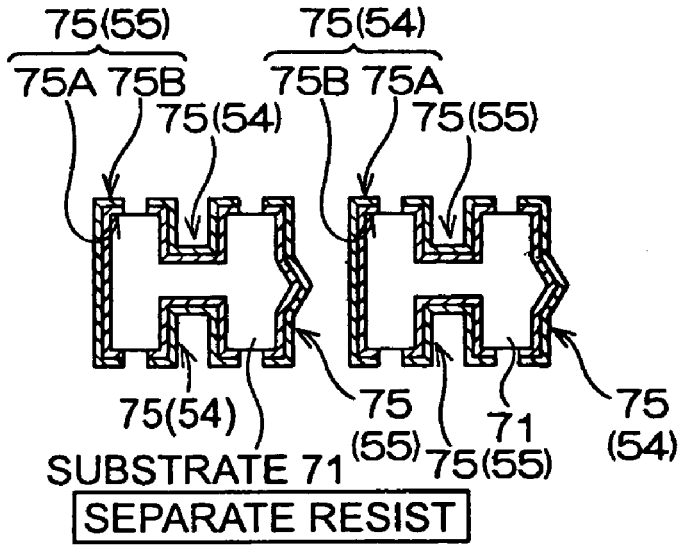

Finally, as shown in FIG. 10P, the unnecessary resist 76 is all separated.

Through the above processes, the piezoelectric resonator element 32 having the structure described with FIGS. 3 and 4 is completed.

Therefore, the piezoelectric resonator element 32 that is completed as shown in FIG. 3 is bonded to the inside of the package 36 by utilizing the conductive adhesive 43 as shown in FIGS. 1 and 2. Thereafter, the lid 39 is joined to the package 36 by using a brazing material (for example, low-melting glass). Then, the package 36 is heated in a vacuum so as to de-gas the package 36 via the through hole 37, and the through hole 37 is vacuum-sealed with the sealant 38. Thus, the piezoelectric device 30 is completed.

The piezoelectric device 30 of the present embodiment has the structure shown in FIGS. 1 and 2. One example of a method of manufacturing the piezoelectric device 30 will now be described referring to FIG. 11 mainly.

Figure 11:
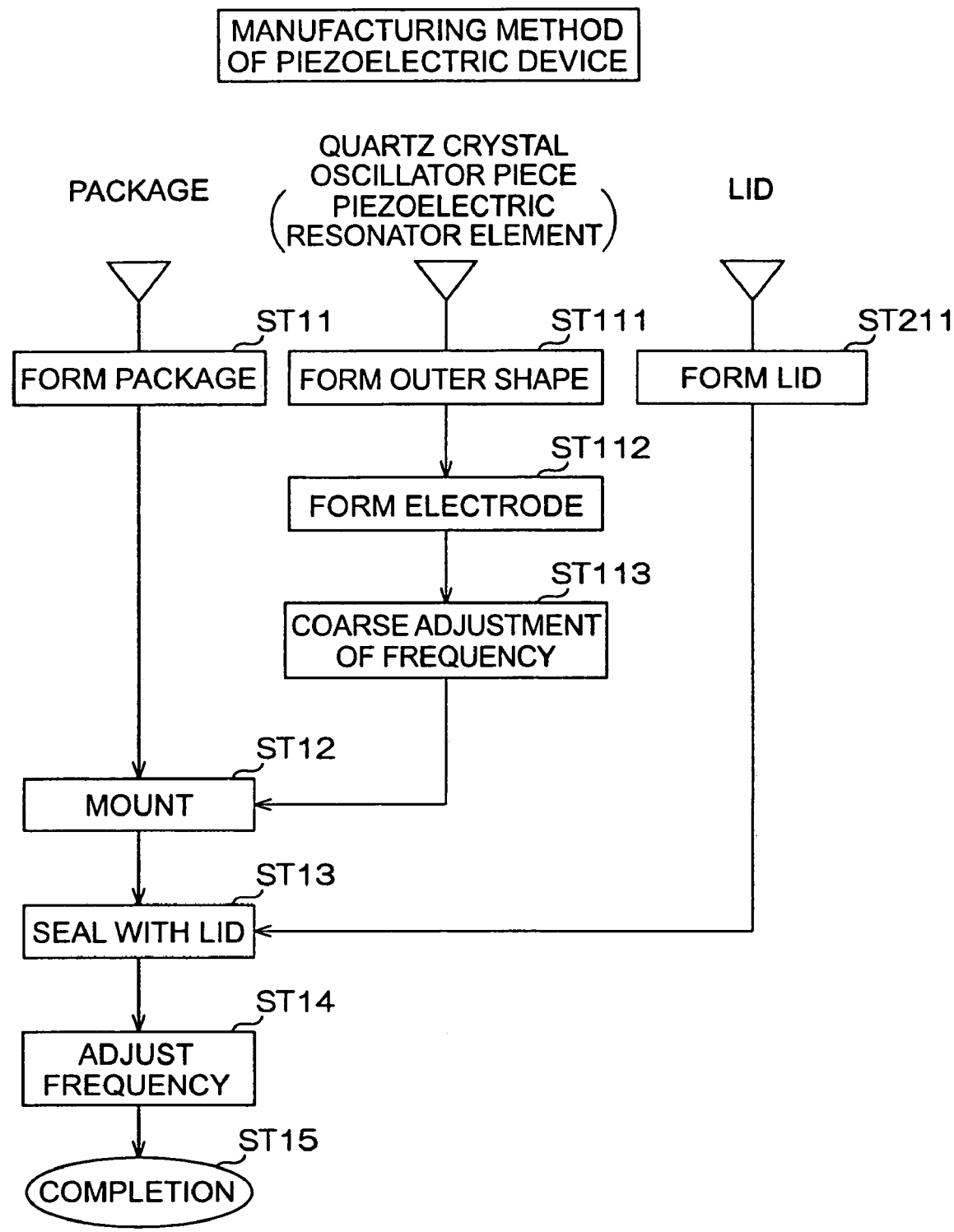
FIG. 11 is a diagram showing an example of a method of manufacturing a piezoelectric device.

FIG. 11 is a flow chart showing one example of a method of manufacturing the piezoelectric device 30.

Forming Process

First, the package 36 of FIGS. 1 and 2 is formed (step ST11) and prepared. Aside from this, the lid 39 is formed (step ST211).

Next, in a step ST111, which is a first step of the forming process for a piezoelectric resonator element, for example, the outer shape of the piezoelectric resonator element is formed by punching a through hole in a quartz crystal wafer or etching a quartz crystal wafer. Then, the quartz crystal wafer is cut in a rectangle shape in accordance with a given orientation so as to obtain the piezoelectric resonator element 32 shown in FIG. 1. The piezoelectric resonator element 32 is formed by etching the outer shape thereof through manufacturing processes shown in FIGS. 7, 8 and 9K.

Then, in a step ST112, which is a second step of the forming process, the above described excitation electrodes 54 and 55 and the extraction electrodes 52 and 53 are formed in the piezoelectric resonator element 32 shown in FIG. 3. The excitation electrodes 54 and 55, and the extraction electrodes 52 and 53 are constituted by stacking the lower layer (lower metal layer) formed of chromium and so forth, and the electrode layer of silver (Ag) or gold (Au), for example. These electrodes are sequentially deposited with sputtering and are formed by a photo process using a mask. For example, the excitation electrodes 54 and 55 are formed through manufacturing processes shown in FIG. 9L, 9M and 10.

Subsequently, in a step ST113 of FIG. 11, driving voltage is applied to the piezoelectric resonator element 32 so as to measure the frequency. Then, by adding an electrode film and trimming a part thereof with laser light and so forth, the coarse adjustment of the frequency is carried out.

Next, in a step ST12 of FIG. 11, the piezoelectric resonator element 32 is mounted inside the prepared package 36.

Sealing Process

Then, in a step ST13, which is a sealing process, the package 36 of FIG. 2 is sealed by the lid 39 with the sealant 33 in a vacuum or in the atmosphere of an inactive gas such as nitrogen, and thus the package 36 is hermetically sealed.

Next, in a step ST14 of FIG. 11, as described with FIG. 2, frequency adjustment is implemented, and thus the piezoelectric device 30, which is a piezoelectric resonator, is completed (step ST15).

Figure 12:
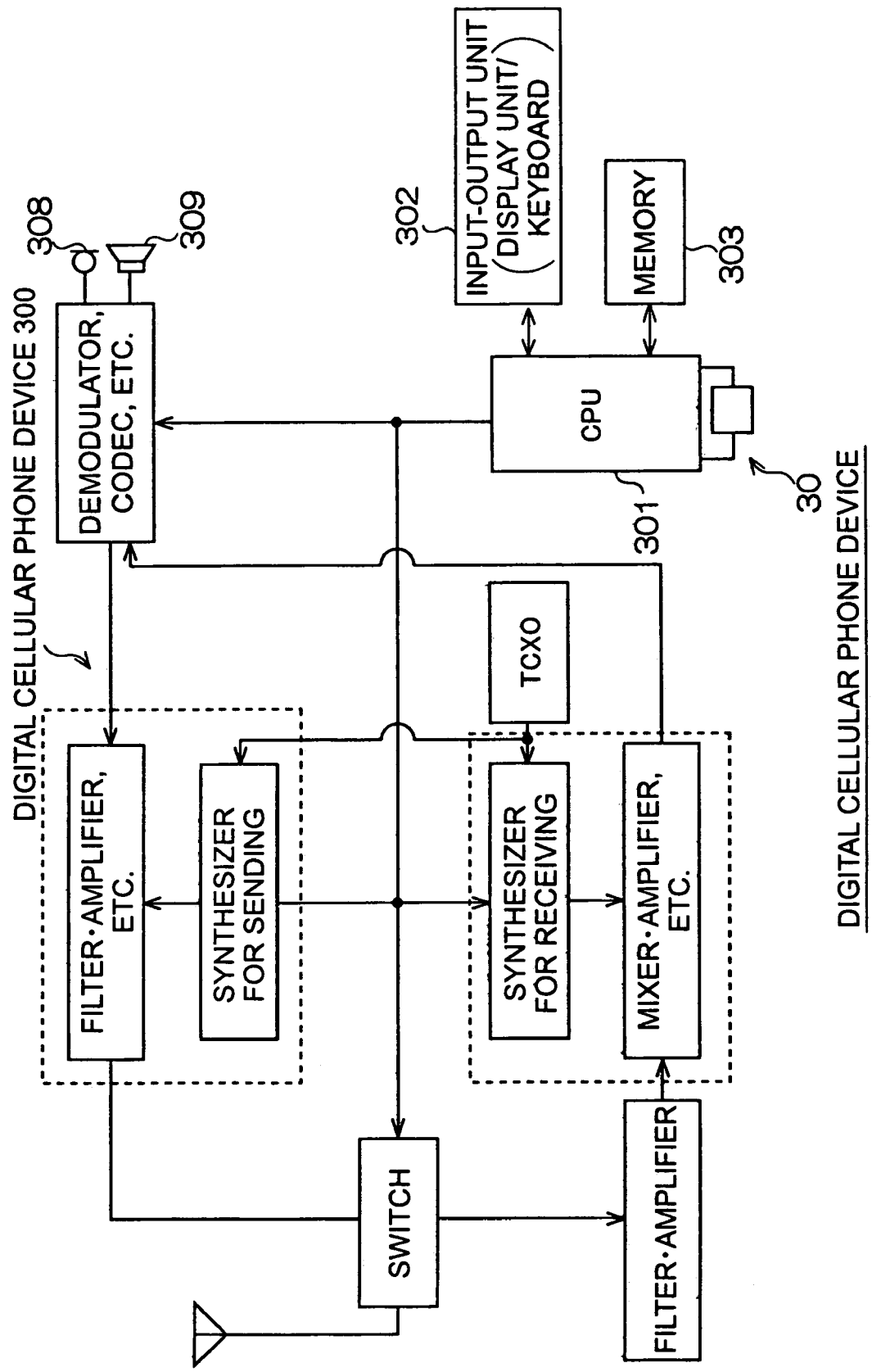
FIG. 12 is a diagram showing an example of a digital cellular phone device.

FIG. 12 is a drawing showing the schematic structure of a digital cellular phone device as one example of electronic equipment utilizing a piezoelectric device according to the above embodiment of the present invention.

Referring to the drawing, a microphone 308 receiving audio of a transmitter, and a speaker 309 for converting a received matter into an audio output are included. In addition, a controller (CPU) 301 made up of integrated circuits and so forth is included as a control unit connected to a modulation unit and demodulation unit of a sent and received signal.

The controller 301, in addition to modulation and demodulation of sent and received signals, controls an information input-output unit 302 made up of an LCD as an image display unit, operation keys for inputting information and so forth. The controller 301 also controls information storage means (memory) 303 including a random access memory (RAM), a read only memory (ROM) and so forth. Therefore, the piezoelectric device 30 is attached to the controller 301, and thus the output frequency is utilized as a clock signal matched to the controlling by a given divider (not shown) and so forth incorporated in the controller 301. The piezoelectric device 30 attached to the controller 301 may be, instead of a single piece of the piezoelectric device 30, an oscillator obtained by combining the piezoelectric device 30 and a given divider and so forth.

In this manner, the piezoelectric device 30 according to the above embodiment of the present invention or other modifications of a piezoelectric device is applicable to electronic equipment such as the digital cellular phone device 300 including a control unit. In this case, since there is a flat part in the temperature characteristic curve, the changes of frequency tolerance due to temperature changes are reduced so that the operation accuracy of electronic equipment is improved.

Figure 13:
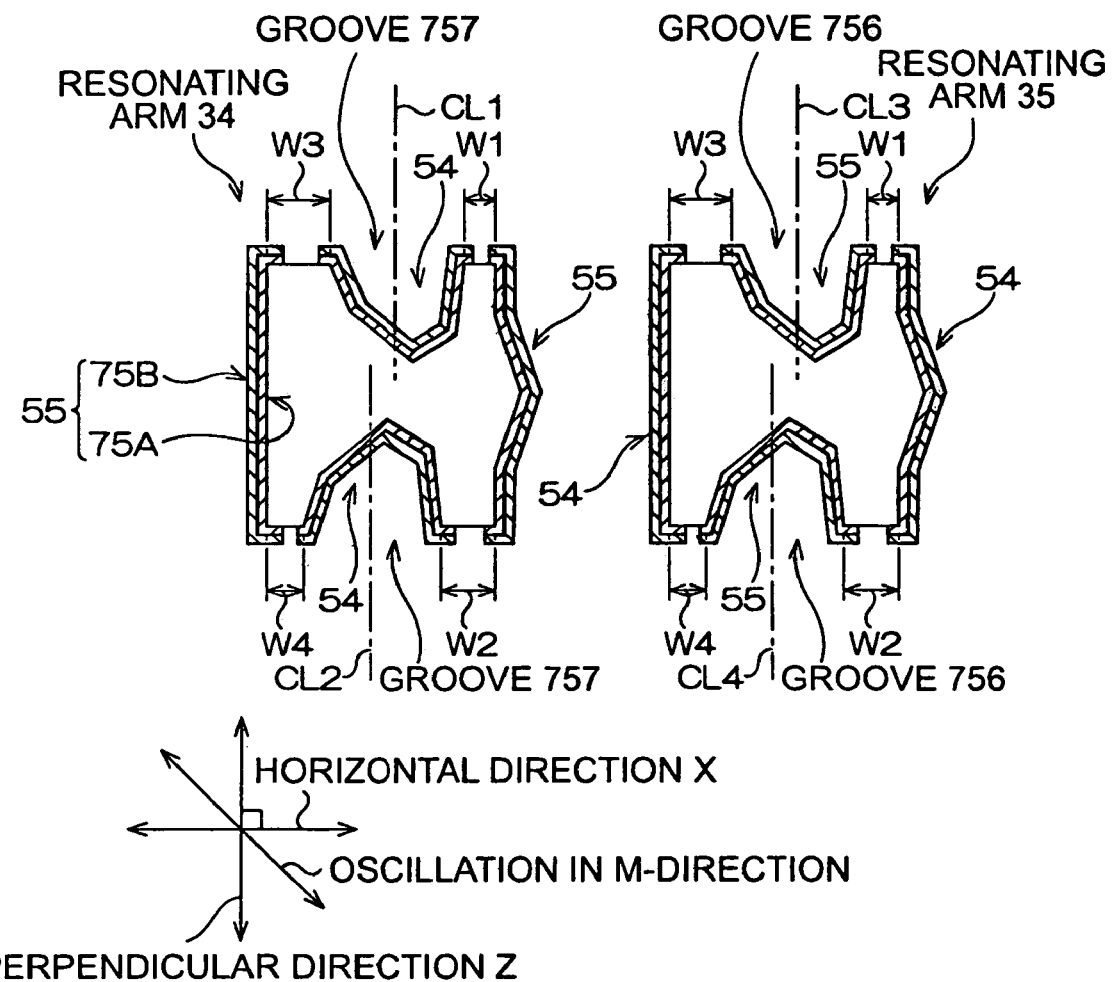
FIG. 13 is a diagram showing another example of a sectional shape of resonating arms.

FIG. 13 shows another sectional structure example along C-C line in the resonating arm of the piezoelectric resonator element of FIG. 3. In the sectional structure example of the resonating arms 34 and 35 of FIG. 13, the resonating arms 34 and 35 have a substantially H-shape. Grooves 757 are formed on both front and back surface sides of one resonating arm 34. Grooves 756 are formed on both front and back surface sides of the other resonating arm 35.

A center line CL1 of the groove 757 of the resonating arm 34 and a center line CL2 of the groove 757 on the back surface side are positioned in such a manner that the directions thereof are offset relative to each other. Namely, the grooves 757 and 757 are offset relative to each other in the X-direction (horizontal direction). Thus, on the front surface side of the resonating arm 34, width W3 is larger than width W1. On the back surface side, width W2 is larger than width W4.

Similarly, a center line CL3 of the groove 756 on the front surface side of the resonating arm 35 and a center line CL4 of the groove 756 on the back surface side are offset, relative to each other, in the horizontal direction, which is the X-direction.

The center lines CL1 and CL4 are parallel to the z-direction.

On the contrary, in a conventional piezoelectric resonator element, the center lines of the grooves on the front and back surface sides correspond with each other.

The resonating arms 34 and 35 have the excitation electrodes 54 and 55, respectively. The excitation electrodes 54 and 55 have the lower layer 75A and the electrode layer 75B similarly to the embodiment of FIG. 4.

If the grooves of the resonating arms 34 and 35 are disposed as shown in FIG. 13, when the resonating arms 34 and 35 oscillate in the horizontal direction, which is the X-direction, the vibration component in the perpendicular direction, which is the Z-direction, is caused in addition to the vibration in the horizontal direction. As a result, the vibration in the M direction, which is an oblique direction, is caused. This is because the difference in the magnitude of the electric field between the front surface side and the back surface side is caused with respect to the X-direction, which is the horizontal direction. In order to cause flexural vibration in the horizontal direction, the mechanical value of expansion and contraction of the tuning fork arm portion that are caused by the electric field needs to be in equilibrium between the front surface side and the back surface side. However, if the magnitude of an electric field is different between the front surface side and the back surface side as shown in FIG. 13, the mechanical value of expansion and contraction of the tuning fork arm portion is disrupted, and therefore the vibration component in the Z-direction is added to the flexural vibration in the X-direction so as to generate the vibration in the M-direction.

In this manner, by making the grooves on the front and back surface sides of the resonating arm be offset relative to each other so as to make the positions of the grooves on the front and back surface sides be asymmetric, the temperature characteristic curve with small second order temperature coefficient that has a flat part as shown in FIG. 6 can be obtained so that the temperature characteristic becomes favorable.

The embodiment shown in FIG. 13 and the embodiment shown in FIG. 4 may be combined of course.

The structures of the embodiments can be accordingly combined with each other. Alternatively, a part of the structure can be omitted, and other structure not shown can be combined therewith.

Furthermore, this invention can be applied to all piezoelectric resonator elements and piezoelectric devices utilizing a piezoelectric resonator element regardless of the kinds such as a crystal resonator, a crystal oscillator, a gyro sensor, and an angle sensor, if they are constituted by containing a piezoelectric resonator element in a package or a box-manner lid.

In the above embodiment, a box-shaped body made up of ceramic is utilized as a package. However, the present invention is not limited to such a conformation but also applies to equivalent devices including any package or case if the devices are constituted by containing a piezoelectric resonator element as a package such as a metal cylinder.

The present invention is not limited to the above embodiments, and various modifications are possible without departing from the scope of the claims.

What is claimed is:

1. A piezoelectric device comprising:
   a package including a first substrate, a second substrate, and a through hole formed through the first substrate and the second substrate, the through hole including a first hole formed in the first substrate and a second hole formed in the second substrate, the second hole having a diameter that is less than a diameter of the first hole;
   a metal sealant disposed in the first hole and the second hole;
   an electrode portion formed on the second substrate and spaced apart from the second hole;
   a base portion disposed on the electrode portion and including a notch part;
   a plurality of resonating arms disposed on the package and extending from and parallel to the base portion, the plurality of resonating arms including a groove part formed on a front surface and a back surface of the resonating arms; and
   a driving electrode disposed in the groove part of the resonating arms and including a lower layer and an electrode layer formed on the lower layer, the lower layer including a thickness t in a range of 0.07 micrometers<t<0.3 micrometers;
   wherein the second substrate is disposed between the first substrate and the plurality of resonating arms.

2. The piezoelectric device according to claim 1, wherein the lower layer is composed of chromium, and the electrode layer is composed of gold.

3. The piezoelectric device according to claim 1, wherein the thickness t of the lower layer is in a range of 0.07 micrometers<t<0.15 micrometers.

4. The piezoelectric device according to claim 1, wherein the thickness t of the lower layer is in a range of 0.09 micrometers<t<0.11 micrometers.

5. A cellular phone device obtaining a clock signal for control by using a piezoelectric device, comprising:
   a package including a first substrate, a second substrate, and a through hole formed through the first substrate and the second substrate, the through hole including a first hole formed in the first substrate and a second hole formed in the second substrate, the second hole having a diameter that is less than a diameter of the first hole;
   a metal sealant disposed in the first hole and the second hole;
   an electrode portion formed on the second substrate and spaced apart from the second hole;
   a base portion disposed on the electrode portion and including a notch part;
   a plurality of resonating arms disposed on the package and extending from and parallel to the base portion, the plurality of resonating arms including a groove part formed on a front surface and a back surface of the resonating arms; and
   a driving electrode disposed in the groove part of the resonating arms and including a lower layer and an electrode layer formed on the lower layer, the lower layer including a thickness t in a range of 0.07 micrometers<t<0.3 micrometers;
   wherein the second substrate is disposed between the first substrate and the plurality of resonating arms.

6. Electronic equipment obtaining a clock signal for control by using a piezoelectric device, comprising:
   a package including a first substrate, a second substrate, and a through hole formed through the first substrate and the second substrate, the through hole including a first hole formed in the first substrate and a second hole formed in the second substrate, the second hole having a diameter that is less than a diameter of the first hole;
   a metal sealant disposed in the first hole and the second hole;
   an electrode portion formed on the second substrate and spaced apart from the second hole;
   a base portion disposed on the electrode portion and including a notch part;
   a plurality of resonating arms disposed on the package and extending from and parallel to the base portion, the plurality of resonating arms including a groove part formed on a front surface and a back surface of the resonating arms; and
   a driving electrode disposed in the groove part of the resonating arms and including a lower layer and an electrode layer formed on the lower layer, the lower layer including a thickness t in a range of 0.07 micrometers<t<0.3 micrometers;
   wherein the second substrate is disposed between the first substrate and the plurality of resonating arms.

7. The piezoelectric device according to claim 1, wherein the through hole is disposed between two resonating arms of the plurality of resonating arms.

8. The piezoelectric device according to claim 1, wherein the package further includes a third substrate disposed on the second substrate.

9. The piezoelectric device according to claim 8 further comprising a lid extending over the base and the plurality of resonating arms and attached to the third substrate by a sealant.

* * * * *